US012642091B2

(12) United States Patent
Yonetsu et al.

(10) Patent No.: US 12,642,091 B2
(45) Date of Patent: May 26, 2026

(54) BONDED BODY, CERAMIC-COPPER CIRCUIT BOARD, AND SEMICONDUCTOR DEVICE

(71) Applicant: Niterra Materials Co., Ltd., Yokohama (JP)

(72) Inventors: Maki Yonetsu, Mitaka (JP); Seiichi Suenaga, Yokohama (JP); Sachiko Fujisawa, Kawasaki (JP); Takashi Sano, Fujisawa (JP)

(73) Assignee: Niterra Materials Co., Ltd., Yokohama (JP)

( * ) Notice: Subject to any disclaimer, the term of this patent is extended or adjusted under 35 U.S.C. 154(b) by 465 days.

(21) Appl. No.: 18/191,318

(22) Filed: Mar. 28, 2023

(65) Prior Publication Data

US 2023/0260868 A1 Aug. 17, 2023

Related U.S. Application Data

(63) Continuation of application No. PCT/JP2021/038712, filed on Oct. 20, 2021.

(30) Foreign Application Priority Data

Oct. 22, 2020 (JP) ................................ 2020-177286

(51) Int. Cl.
*H10W 40/25* (2026.01)
*C04B 37/02* (2006.01)
(Continued)

(52) U.S. Cl.
CPC ........... *H10W 40/255* (2026.01); *C04B 37/02* (2013.01); *H05K 1/0306* (2013.01); *H10W 70/692* (2026.01); *C04B 2235/96* (2013.01)

(58) Field of Classification Search
CPC ........ C04B 2237/125; C04B 2237/127; C04B 2237/58; H01W 40/255
See application file for complete search history.

(56) References Cited

U.S. PATENT DOCUMENTS

2016/0221305 A1 8/2016 Terasaki et al.
2017/0323842 A1 11/2017 Tani et al.
(Continued)

FOREIGN PATENT DOCUMENTS

CN 105452195 A 3/2016
CN 108290250 A 7/2018
(Continued)

OTHER PUBLICATIONS

Combined Chinese Office Action and Search Report issued Jun. 28, 2024 in Chinese Application 202180072058.5, (with English translation), 8 pages.
(Continued)

*Primary Examiner* — Adam Krupicka
(74) *Attorney, Agent, or Firm* — Oblon, McClelland, Maier & Neustadt, L.L.P.

(57) ABSTRACT

A bonded body according to an embodiment includes a ceramic substrate, a copper plate, and a bonding layer. The bonding layer is located on at least one surface of the ceramic substrate and bonds the ceramic substrate and the copper plate. The bonding layer includes Ag and Ti. The copper plate includes a first region, a second region, and a third region. The first region is separated from the bonding layer in a thickness direction. The second region is located between the bonding layer and the first region and has a higher Ag concentration than the first region. The third region is located between the bonding layer and the second region and has a lower Ag concentration than the second region.

12 Claims, 2 Drawing Sheets

(51) Int. Cl.
   *H05K 1/03*          (2006.01)
   *H10W 70/692*          (2026.01)

(56)                    References Cited

U.S. PATENT DOCUMENTS

| | | | |
|---|---|---|---|
| 2018/0277506 A1 | 9/2018 | Watanabe et al. | |
| 2019/0150298 A1 | 5/2019 | Kishimoto | |
| 2019/0327831 A1 | 10/2019 | Kato et al. | |
| 2022/0064074 A1* | 3/2022 | Nishimoto | .............. B32B 15/20 |

FOREIGN PATENT DOCUMENTS

| | | | |
|---|---|---|---|
| CN | 109315061 A | 2/2019 | |
| EP | 0 480 038 A1 | 4/1992 | |
| EP | 3 031 789 A1 | 6/2016 | |
| EP | 3 053 899 A1 | 8/2016 | |
| EP | 3 492 441 A1 | 6/2019 | |
| EP | 3 606 299 A1 | 2/2020 | |
| JP | 2016-169111 A | 9/2016 | |
| JP | 2018-506496 A | 3/2018 | |
| WO | WO 2015/019602 A1 | 2/2015 | |
| WO | WO 2018/021472 A1 | 2/2018 | |
| WO | WO 2018/180965 A1 | 10/2018 | |

OTHER PUBLICATIONS

Extended European Search Report Issued Sep. 9, 2024 in European Application 21882852.3, 7 pages.
International Search Report issued Nov. 22, 2021, in PCT/JP2021/038712 filed on Oct. 20, 2021, 2 pages.

* cited by examiner

BONDED BODY, CERAMIC-COPPER CIRCUIT BOARD, AND SEMICONDUCTOR DEVICE

CROSS-REFERENCE TO RELATED APPLICATIONS

This is a continuation application of International Patent Application PCT/JP2021/038712, filed on Oct. 20, 2021. This application also claims priority to Japanese Patent Application No. 2020-177286, filed on Oct. 22, 2020. The entire contents of which are incorporated herein by reference.

FIELD

Embodiments described below relate generally to a bonded body, a ceramic-copper circuit board, and a semiconductor device.

BACKGROUND

A bonded body of a ceramic substrate and a copper plate is used as a circuit board for mounting a semiconductor element or the like. WO 2018/180965 (Patent Document 1) discusses a ceramic-copper circuit board in which a ceramic substrate and a copper plate are bonded. In Patent Document 1, the crystal grain size of the copper plate and the diffusion amount of Ag inside the copper plate are controlled. By performing such a control in Patent Document 1, the temperature cycle test (TCT) characteristics of the ceramic-copper circuit board are improved.

On the other hand, as ceramic-copper circuit board sizes increase, there are ceramic-copper circuit boards in which the TCT characteristics are not improved.

DETAILED DESCRIPTION

A bonded body according to an embodiment includes a ceramic substrate, a copper plate, and a bonding layer. The bonding layer is located on at least one surface of the ceramic substrate and bonds the ceramic substrate and the copper plate. The bonding layer includes Ag and Ti. The copper plate includes a first region, a second region, and a third region. The first region is separated from the bonding layer in a thickness direction. The second region is located between the bonding layer and the first region and has a higher Ag concentration than the first region. The third region is located between the bonding layer and the second region and has a lower Ag concentration than the second region.

Figure 1:
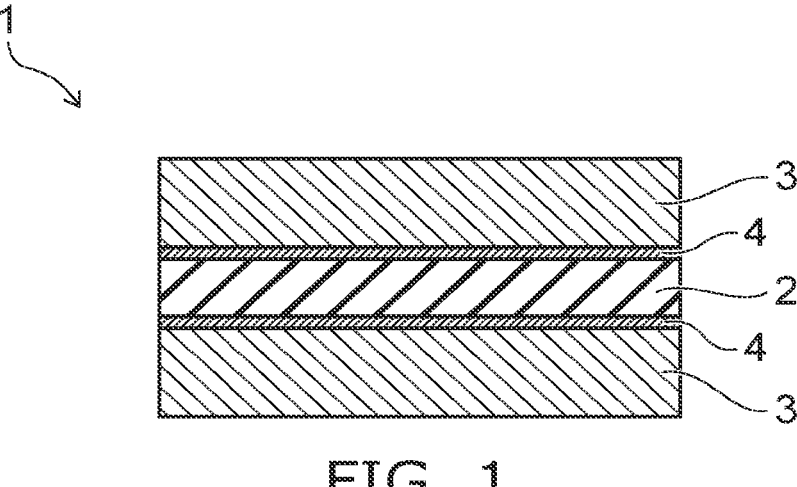
FIG. 1 is a schematic view showing an example of a bonded body according to an embodiment.

FIG. 1 is a schematic view showing an example of a bonded body according to an embodiment. In FIG. 1, 1 is a bonded body, 2 is a ceramic substrate, 3 is a copper plate, and 4 is a bonding layer.

FIG. 1 shows the bonded body 1 in which the copper plate 3 is located at each of two surfaces of the ceramic substrate 2 with the bonding layers 4 interposed. In the example shown in FIG. 1, the longitudinal and lateral sizes of the ceramic substrate 2 are equal to the longitudinal and lateral sizes of the copper plate 3. The bonded body according to the embodiment is not limited to such a configuration. The bonded body 1 may have a structure in which the copper plate is located at only one surface of the bonded body 1. The longitudinal and lateral sizes of the ceramic substrate 2 may be different from the longitudinal and lateral sizes of the copper plate 3.

Figure 2:
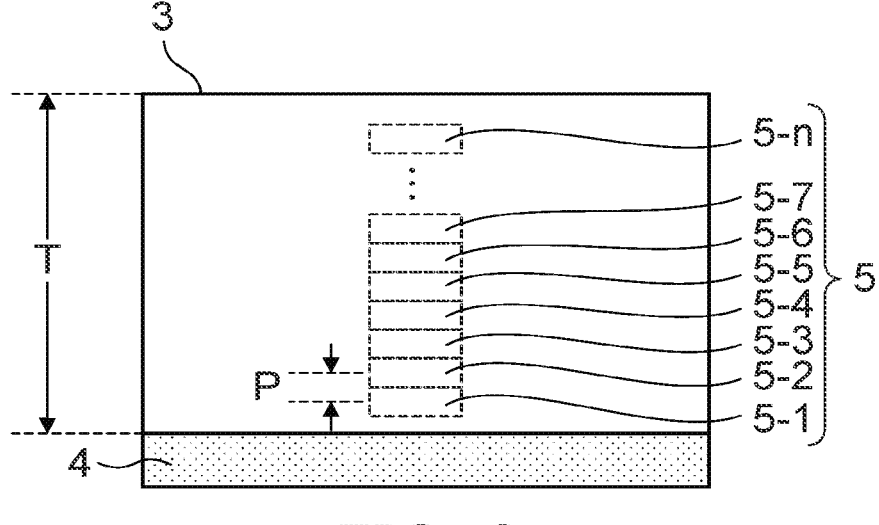
FIG. 2 is a schematic view showing an example of a measurement region measuring the Ag concentration in a copper plate.

FIG. 2 is a schematic view showing an example of a measurement region measuring the Ag concentration in a copper plate. In FIG. 2, 3 is a copper plate, 4 is a bonding layer, 5 is a measurement region, T is the thickness of the copper plate, and P is the spacing (pitch) between the measurement regions. 5-1 is a first measurement region, 5-2 is a second measurement region, 5-3 is a third measurement region, 5-4 is a fourth measurement region, 5-5 is a fifth measurement region, 5-6 is a sixth measurement region, 5-7 is a seventh measurement region, and 5-$n$ is an nth measurement region. n examples of the measurement region are shown in FIG. 2.

First, any cross section of the bonded body 1 is set as the location to be measured. The cross section is a surface perpendicular to the direction connecting the ceramic substrate 2 and the copper plate 3. That is, the cross section is a surface perpendicular to the bonding surface of the ceramic substrate 2 and the copper plate 3.

Then, the pitch P of the multiple measurement regions is determined. The multiple measurement regions are arranged at uniform spacing at a pitch of not less than 30 μm and not more than 100 μm in the thickness direction of the copper plate 3. The pitch is the spacing P between the centers of the measurement regions arranged vertically. The spacing P between the centers of the measurement regions also is called the pitch P. The pitch P is a constant spacing within the range of 30 to 100 μm. For example, when the pitch P is set to be 50 μm, the pitch P is always 50 μm. Also, when the pitch P is set to be 100 μm, the pitch P is always 100 μm.

The length in the width direction of one measurement region 5 is within the range of not less than 100 μm and not more than 200 μm. The length in the thickness direction of one measurement region 5 is within the range of not less than 10 μm and not more than 100 μm. The measurement region 5 is a quadrilateral defined by the width direction× thickness direction. The width direction is a direction parallel to the ceramic substrate 2 surface. That is, the width direction is a direction parallel to the copper plate 3 surface. The thickness direction is a direction perpendicular to the ceramic substrate 2 surface, and is the thickness direction of the copper plate 3. The measurement regions 5 are arranged in the thickness direction of the copper plate 3.

One size is selected as the size of each measurement region 5 from the range of not less than 100 μm and not more than 200 μm in the width direction×not less than 10 μm and not more than 100 μm in the thickness direction. For example, when the size of the measurement region 5 is set to be 150 μm in the width direction×50 μm in the thickness direction, the sizes of all of the measurement regions 5 are 150 μm in the width direction×50 μm in the thickness direction.

When the size of the measurement region 5 has been determined, the measurement regions are designated to match the pitch P described above. The pitch P is counted from the bonding surface of the copper plate 3. Positioning is performed to be alternately pitch P→measurement region 5→pitch P→measurement region 5. In FIG. 2, the measurement region that is most proximate to the bonding layer 4 is set as the first measurement region 5-1. The measurement region that is most distant to the bonding layer 4 is set as the nth measurement region 5-n.

When the measurement regions 5 have been set, the Ag concentrations of the measurement regions 5 are measured using energy dispersive X-ray spectroscopy (EDX). EDX also is called EDS. The Ag concentration is measured for each measurement region. Therefore, the Ag concentrations of the n measurement regions including the first to nth measurement regions 5-1 to 5-n are measured.

A Scanning Electron Microscope (SEM)-EDX is used to measure the Ag concentrations. JED-2300 made by JEOL Ltd. or a device having equivalent performance is used as the SEM-EDX. The Ag concentration is measured as atomic % to two decimal places. Also, the time for the peaks to stabilize in the EDX measurement is recorded. Field Emission (FE)-SEM may be used as SEM.

The copper plate 3 is characterized in that the copper plate 3 includes a portion in which a region having a relatively low Ag concentration, a region having a relatively high Ag concentration, and a region having a relatively low Ag concentration are arranged in this order from the ceramic substrate 2 side toward the side opposite to the ceramic substrate 2 side. The direction from the ceramic substrate 2 side toward the side opposite to the ceramic substrate 2 side is the so-called thickness direction of the copper plate 3. That is, this direction is a direction from the bonding layer 4 toward the copper plate 3 surface.

For example, the copper plate 3 includes the first region, the second region, and the third region. The first region is separated from the bonding layer 4 in the thickness direction. The second region is positioned between the bonding layer and the first region and has a higher Ag concentration than the first region. The third region is positioned between the bonding layer and the second region and has a lower Ag concentration than the second region. The first region is positioned at the front side of the copper plate 3 when viewed from the second and third regions.

The first to third regions are a portion of the multiple measurement regions and are next to each other in the thickness direction. Therefore, the first to third regions are arranged at a pitch of not less than 30 μm and not more than 100 μm in the thickness direction. The sizes of the first to third regions each 20 are not less than 100 μm and not more than 200 μm in the width direction×not less than 10 μm and not more than 100 μm in the thickness direction.

As described above, a region having a relatively low Ag concentration, a region having a relatively high Ag concentration, and a region having a relatively low Ag concentration are arranged in this order in a portion of the copper plate 3. This means that when the Ag concentrations of the measurement regions are compared in order from the bonding layer 4 toward the copper plate 3 surface, there exists a location made of a region having a relatively low Ag concentration, a region having a relatively high Ag concentration, and a region having a relatively low Ag concentration. Suppose, for example, that multiple measurement regions 5 that include the first to nth measurement regions 5-1 to 5-n are set. Among the first to nth 35 measurement regions 5-1 to 5-n, there exists three measurement regions arranged in the order of a region having a relatively low Ag concentration→a region having a relatively high Ag concentration→a region having a relatively low Ag concentration in the direction from the bonding layer 4 toward the copper plate 3 surface. Hereinafter, the region having the relatively high Ag concentration (the second region) also is called the "high-concentration region". The region having the relatively low Ag concentration (the first region and the third region) also is called the "low-concentration region".

Conventionally, the diffusion amount of Ag into the copper plate decreases from the bonding layer toward the copper plate front surface. Therefore, when comparing the Ag concentrations of the measurement regions arranged in order, the Ag concentration is arranged in the order of high→low→lower. Conversely, at a portion of the copper plate 3 in the bonded body 1 according to the embodiment, the region having the relatively low Ag concentration→region having the relatively high Ag concentration→region having the relatively low Ag concentration are arranged in this order. It is sufficient for at least one area including such a Ag concentration undulation made of the three regions to exist. Two or more areas having Ag concentration undulations may be included in the copper plate 3. Favorably, only one such area is included in the copper plate 3.

When n measurement regions including the first to nth measurement regions 5-1 to 5-n are set, for example, an area that includes the first measurement region 5-1, the second measurement region 5-2, and the third measurement region 5-3 includes a Ag concentration undulation. The third measurement region 5-3 corresponds to the above-mentioned first region. The second measurement region 5-2 corresponds to the above-mentioned second region. The first measurement region 5-1 corresponds to the above-mentioned third region. Or, one of an area including the second measurement region 5-2, the third measurement region 5-3, and the fourth measurement region 5-4, an area including the third measurement region 5-3, the fourth measurement region 5-4, and the fifth measurement region 5-5, an area including the fourth measurement region 5-4, the fifth measurement region 5-5, and the sixth measurement region 5-6, or an area including the fifth measurement region 5-5, the sixth measurement region 5-6, and the seventh measurement region 5-7 may include a Ag concentration undulation. Two or more of these areas may include Ag concentration undulations.

Also, the copper plate front surface is not included in a measurement region. Therefore, a location that is separated not less than 30 μm from the copper plate front surface is used as the nth measurement region. The separation of not less than 30 μm is because the pitch P is not less than 30 μm and not more than 100 μm. Ag may be detected or may not be detected at the copper plate front surface.

Thus, it is important for an area including a Ag concentration undulation to exist, and for the copper plate 3 to have a Ag concentration distribution. By the copper plate 3 having a Ag concentration distribution, the TCT characteristics of the bonded body and the ceramic-copper circuit board can be improved. The existence of an area that includes a Ag concentration undulation means that a high-concentration region exists inside the copper plate when the copper plate is viewed in the thickness direction. Ag mainly exists at the grain boundaries of the copper crystals of the copper plate. By Ag existing at the grain boundaries of the copper crystals, the thermal expansion of the copper plate can be suppressed by a pinning effect. Therefore, the TCT characteristics can be improved. Also, by forming a low-concentration region between the bonding layer and the high-concentration region, the thermal expansion can be suppressed while leveraging the thermal conductivity and electrical conductivity of the copper plate. For example, the warp amount of the bonded body can be not more than 0.2 mm even when the bonded body size becomes large, i.e., not less than 200 mm long or wide. Whether or not Ag exists at the grain boundaries of the copper plate can be known by combining a SEM photograph with component analysis by SEM-EDX. First, the location of a grain boundary of the copper plate is designated using a SEM photograph. Whether or not Ag exists at the grain boundary of the copper plate can be confirmed by analyzing the location identified by the SEM photograph with EDX.

It is favorable for the high-concentration region (the second region) to exist within the range of not less than 0.1 mm and not more than 0.5 mm. The range of not less than 0.1 mm and not more than 0.5 mm is the distance referenced to the boundary between the bonding layer and the copper plate. "0.1 mm" is a position more proximate to the bonding layer 4. "0.5 mm" is near the thickness-direction center of the copper plate 3. The thermal expansion of the copper plate can be suppressed by forming the high-concentration region between the bonding layer 4 and the central portion of the copper plate 3. Also, it is favorable for the high-concentration region to exist in the range of 0.3T to 0.5T with respect to the thickness T of the copper plate. The boundary of the copper plate 3 and the bonding layer 4 is defined using a location at which the Ag amount is 5 atomic % as a reference. The Ag inside the bonding layer diffuses into the copper plate. The Ag amount decreases from the bonding layer toward the copper plate. The location from the bonding layer toward the copper plate at which the Ag amount becomes 5 atomic % is defined as the boundary of the copper plate 3 and the bonding layer 4.

It is favorable for the Ag concentration of the high-concentration region to be not less than 0.1 atomic % when the total concentration of Ag and Cu is taken to be 100 atomic %. In other words, it is favorable for $0.1 \leq C_{Ag}/(C_{Ag}+C_{Cu})$, where $C_{Ag}$ is the actual Ag concentration (atomic %) in the high-concentration region, and $C_{Cu}$ is the actual Cu concentration (atomic %) in the high-concentration region. Also, it is favorable for the Ag concentration of the high-concentration region to be not more than 0.4 atomic % when the total concentration of Ag and Cu is taken to be 100 atomic %. There is a possibility that the goodness of the copper plate (the thermal conductivity and the electrical conductivity) may not be leveraged if the Ag concentration in the copper plate becomes too high.

It is favorable for the difference between the Ag concentration of the low-concentration region and the Ag concentration of the high-concentration region to be not less than 0.05 atomic % when the total concentration of Ag and Cu is taken to be 100 atomic %. The effects can be improved by setting the Ag concentration difference to be not less than 0.05 atomic %.

It is favorable for the thickness T of the copper plate 3 to be not less than 0.8 mm. The deformation amount due to thermal expansion increases when the copper plate 3 is thick. However, the thermal expansion can be suppressed by controlling the Ag concentration.

A pure copper plate or a copper alloy plate can be used as the copper plate 3. It is favorable for the copper plate to be oxygen-free copper. Oxygen-free copper is one type of pure copper. Oxygen-free copper is copper having a copper purity of not less than 99.96 mass % as indicated in JIS-H-3100 (ISO 1337, etc.).

A silicon nitride substrate, an aluminum nitride substrate, an aluminum oxide substrate, an Alusil substrate, etc., are examples of the ceramic substrate 2. An Alusil substrate is a substrate formed by mixing aluminum oxide and zirconium oxide.

It is favorable for the thickness of the ceramic substrate 2 to be not less than 0.1 mm and not more than 1 mm. There is a possibility that the strength may degrade when the substrate thickness is less than 0.1 mm. When the thickness is greater than 1 mm, there is a possibility that the ceramic substrate may become a thermal resistor, and the heat dissipation of the bonded body may degrade.

It is favorable for the three-point bending strength of the silicon nitride substrate to be not less than 600 MPa. It is favorable for the thermal conductivity to be not less than 80 W/m·K. The substrate thickness can be thinned by increasing the strength of the silicon nitride substrate. It is therefore favorable for the three-point bending strength of the silicon nitride substrate to be not less than 600 MPa, or even not less than 700 MPa. The substrate thickness of the silicon nitride substrate can be thin, i.e., not more than 0.40 mm, or even not more than 0.30 mm.

The three-point bending strength of an aluminum nitride substrate is about 300 to 450 MPa. On the other hand, the thermal conductivity of an aluminum nitride substrate is not less than 160 W/m·K. Because the strength of the aluminum nitride substrate is low, it is favorable for the substrate thickness to be not less than 0.60 mm.

Although the three-point bending strength of an aluminum oxide substrate is about 300 to 450 MPa, an aluminum oxide substrate is inexpensive. Although the three-point bending strength of an Alusil substrate is high, i.e., about 550 MPa, the thermal conductivity of an Alusil substrate is about 30 to 50 W/m·K.

A silicon nitride substrate is favorable as the ceramic substrate 2. As described above, the substrate thickness can be thin because the strength of the silicon nitride substrate is high. The thermal resistance of the ceramic substrate can be reduced thereby.

The bonding layer 4 includes Ag and Ti. Ti (titanium) is an element that is called an active metal. A bonding method of the ceramic substrate and the copper plate that uses an active metal is called active metal bonding. The bonding layer that includes Ag and Ti is formed using a brazing material including Ag and Ti. A brazing material that includes Ti is called an active metal brazing material. The active metal brazing material also is called simply the brazing material.

By the bonding layer 4 including Ag (silver), the Ag can diffuse into the copper plate 3. The Ag concentration in the copper plate 3 can be controlled by utilizing the diffusion of Ag. Although it also may be considered to use a copper plate that already includes Ag, in such a case, the Ag concentration easily becomes uniform, and it is difficult to control the distribution of the Ag concentration.

In addition to Ag and Ti, it is favorable for the bonding layer 4 to include one, two, or more selected from Cu, Sn, In, and C.

It is favorable for the active metal brazing material to include not less than 20 mass % and not more than 60 mass % of Ag (silver), not less than 25 mass % and not more than 70 mass % of Cu (copper), and not less than 1 mass % and not more than 15 mass % of Ti (titanium) or $TiH_2$ (titanium hydride). Also, when both Ti and $TiH_2$ are used, the total of the two is set within the range of 1 to 15 mass %.

The brazing material may include not less than 1 mass % and not more than 50 mass % of one or two of Sn (tin) or In (indium) as necessary. It is favorable for the content of Ti or $TiH_2$ to be 1 to 15 mass %. The brazing material may include not less than 0.1 mass % and not more than 2 mass % of C (carbon) as necessary.

The ratio of the active metal brazing material composition is calculated using the total of the mixed raw materials as 100 mass %. For example, when the three of Ag, Cu, and Ti are used in the brazing material, Ag+Cu+Ti=100 mass %. When the four of Ag, Cu, TiH$_2$, and In are used in the brazing material, Ag+Cu+TiH$_2$+In=100 mass %. When the five of Ag, Cu, Ti, Sn, and C are included in the bonding layer 4, Ag+Cu+Ti+Sn+C=100 mass %.

Ag or Cu is a component used as the base material of the brazing material. Sn or In has the effect of lowering the melting point of the brazing material. C (carbon) has the effect of controlling the fluidity of the brazing material and controlling the composition of the bonding layer by reacting with other components. Therefore, Ag—Cu—Ti, Ag—Cu—Sn—Ti, Ag—Cu—Ti—C, Ag—Cu—Sn—Ti—C, Ag—Ti, Ag—Sn—Ti, Ag—Ti—C, and Ag—Sn—Ti—C are examples of the components of the brazing material. Also, In may be used instead of Sn. Also, both Sn and In may be used. Also, low melting-point metals such as Bi (bismuth), Sb (antimony), Ga (gallium), etc., may be used instead of Sn and In.

Figure 3:
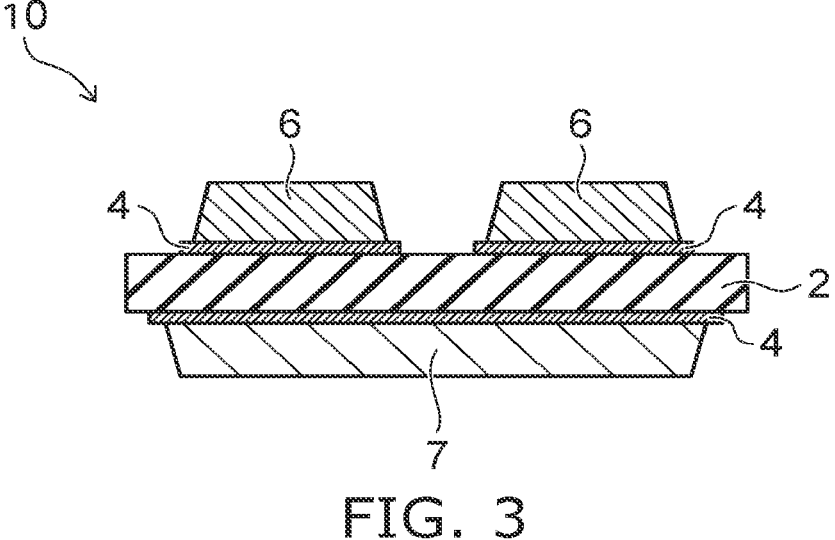
FIG. 3 is a schematic view showing an example of a ceramic-copper circuit board according to an embodiment.

The bonded body described above is favorable for a ceramic-copper circuit board. FIG. 3 is a schematic view showing an example of a ceramic-copper circuit board according to an embodiment. In FIG. 3, 6 is a circuit part, 7 is a heat dissipation plate, and 10 is a ceramic-copper circuit board.

The circuit part 6 is made by providing a circuit structure in the copper plate 3 at the front side. Also, the heat dissipation plate 7 is made by patterning the copper plate 3 at the backside. Although the structure of FIG. 3 includes two circuit parts 6, the structure is not limited to such a structure. Any number or shape of the circuit parts 6 can be provided. Also, the copper plates 3 of two surfaces may be used as the circuit parts 6. Also, the side surfaces of the circuit part 6 and/or the heat dissipation plate 7 may have inclined structures. Also, a bonding layer jutting portion in which the bonding layer 4 juts from the end portions of the circuit part 6 and/or the heat dissipation plate 7 may be provided.

Figure 4:
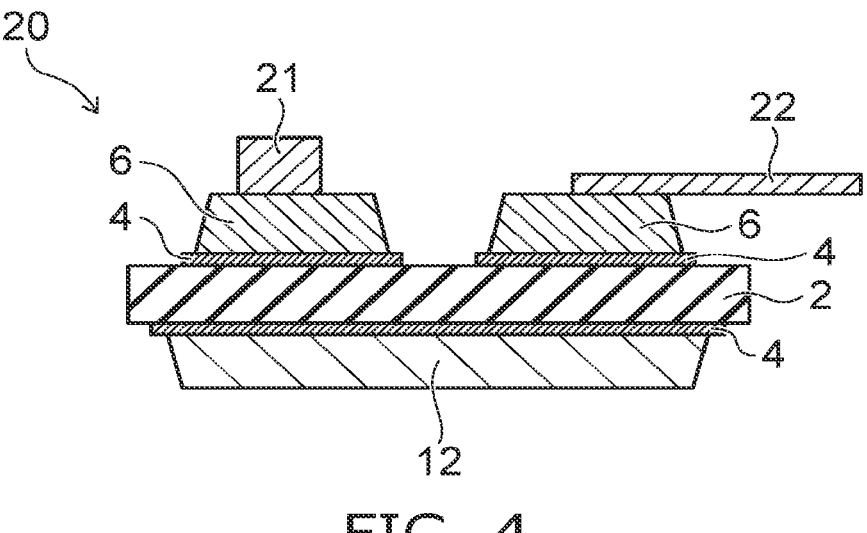
FIG. 4 is a schematic view showing an example of a semiconductor device according to an embodiment.

The ceramic-copper circuit board according to the embodiment is favorable for a semiconductor device. FIG. 4 is a schematic view showing an example of a semiconductor device according to an embodiment. In FIG. 4, 20 is a semiconductor device, 21 is a semiconductor element, and 22 is a leadframe. In the semiconductor device 20 shown in FIG. 5, the semiconductor element 21 is mounted to one of the two circuit parts 6. The leadframe 22 is connected to the other of the two circuit parts 6. The semiconductor device 20 according to the embodiment is not limited to such a structure. As necessary, the number and sizes of the circuit parts 6, the number and sizes of the semiconductor elements 21, etc., are modifiable as appropriate.

A method for manufacturing the bonded body according to the embodiment will now be described. The manufacturing method is not limited as long as the bonded body according to the embodiment has the configuration described above. A method for obtaining the bonded body according to the embodiment with a high yield will now be described.

First, the ceramic substrate 2 is prepared. A silicon nitride substrate, an aluminum nitride substrate, an aluminum oxide substrate, an Alusil substrate, etc., are examples of the ceramic substrate 2.

A copper plate or a copper alloy plate can be used as the copper plate 3. It is favorable for the copper plate to be an oxygen-free copper plate. Oxygen-free copper is copper that has a copper purity of not less than 99.96 mass % as indicated in JIS-H-3100. Also, it is favorable for the average crystal grain size of the copper crystal of the copper plate before bonding to be in the range of not less than 5 μm and not more than 100 μm. The average crystal grain size of the copper crystal is calculated using the line intercept method. The copper crystals are counted along a 10-mm straight line at any location of the copper plate front surface; and the average crystal grain size of the crystals is calculated. The grain boundaries of the copper crystals are the main route along which Ag diffuses. The Ag diffusion amount increases too much when the average crystal grain size of the copper plate is less than 5 μm. Also, the Ag diffusion amount decreases when the average crystal grain size of the copper plate is large and is greater than 100 μm. It is therefore favorable for the average crystal grain size of the copper plate before bonding to be not less than 5 μm and not more than 100 μm, and more favorably not less than 10 μm and not more than 50 μm.

Then, an active metal brazing material paste that includes Ag and Ti is prepared. It is favorable for one, two, or more selected from Cu, Sn, In, and C to be added to the active metal brazing material including Ag and Ti. Ti may be added as a compound of TiH$_2$, etc. The composition ratios of the components (mass %) are as described above.

It is favorable for the average particle size D$_{50}$ of the Ag powder used as the raw material of the brazing material to be not more than 3.0 μm, and more favorably not more than 2.0 μm. It is favorable for the average particle size D$_{50}$ of the Cu powder to be not more than 6.0 μm, and more favorably not more than 4.0 μm. It is favorable for the average particle size D$_{50}$ of the Ti powder or the TiH$_2$ powder to be not more than 6.0 μm, and more favorably not more than 4.0 μm. It is favorable for the average particle size D$_{50}$ of the Sn powder or the In powder to be not more than 6.0 μm, and more favorably not more than 4.0 μm. It is favorable for the average particle size D$_{50}$ of the C powder to be not more than 6.0 μm, and more favorably not more than 4.0 μm.

It is favorable for the average particle size D$_{50}$ of the Ag powder to be less than the average particle size D$_{50}$ of the Cu powder. It is favorable for the average particle size D$_{50}$ of the Ag powder to be less than the average particle size D$_{50}$ of the Sn powder or the In powder. It is favorable for the average particle size D$_{50}$ of the Cu powder to be less than the average particle size D$_{50}$ of the Sn powder or the In powder. By reducing the particle size of the Ag powder, the Ag easily diffuses into the copper plate.

A mixed powder is prepared by mixing and uniformly dispersing the constituent component powders of the active metal brazing material. It is favorable for the mixing time to be not less than 10 hours. Then, an active metal brazing material paste is prepared by mixing the mixed powder with a binder and a solvent. The active metal brazing material paste is coated onto at least one of the ceramic substrate or the copper plate. It is favorable for the thickness of the active metal brazing material paste layer to be not less than 5 μm and not more than 60 μm. The thickness of the active metal brazing material paste layer is the thickness after drying the coated paste. There is a possibility that the bonding strength may decrease when the thickness of the active metal brazing material paste layer is less than 5 μm. When the active metal brazing material paste layer is thick, i.e., greater than 60 μm, there is a possibility that the thermal stress in the bonding process may become large, and the warp of the bonded body may become large. It is therefore favorable for the thickness of the active metal brazing material paste layer to be not less than 5 μm and not more than 60 μm, and more favorably not less than 10 μm and not more than 50 μm.

After the active metal brazing material paste is coated, a process of placing the component on which the paste is not coated is performed. For example, when the active metal brazing material paste is coated onto the ceramic substrate, a process of placing the copper plate on the ceramic substrate is performed. The active metal brazing material paste may be coated onto two surfaces of the ceramic substrate; and the copper plates may be disposed respectively on the two surfaces. An active metal brazing material paste may be coated onto the copper plate; and a ceramic substrate may be disposed on the copper plate.

Then, a bonding process in which the bonding temperature is not more than 900° C. is performed. The bonding temperature is the maximum attained temperature maintained for a certain amount of time. When the bonding temperature is high, the grain growth of the copper crystal grains included in the copper plate is promoted. The diffusion amount of Ag decreases when the grain growth of the copper plate is fast.

It is favorable for the bonding temperature to be not more than 900° C., and more favorably not more than 860° C. Although not particularly limited, it is favorable for the lower limit of the bonding temperature to be not less than 500° C. When the bonding temperature is low, there is a possibility that the reliability of the bond may degrade. It is therefore favorable for the bonding temperature to be not less than 500° C. and not more than 900° C., and more favorably not less than 550° C. and not more than 860° C. It is favorable for the holding time of the bonding temperature to be not more than 100 minutes, and more favorably not more than 30 minutes.

It is favorable for the atmosphere in the bonding process to be a vacuum or a nitrogen atmosphere.

It is favorable for the pressure of the vacuum to be not more than 10-3 Pa. When performed in a vacuum, the Ti inside the brazing material can be prevented from nitriding before reacting with the ceramic substrate.

A nitrogen atmosphere is an atmosphere that includes not less than 90 vol % of nitrogen. It is considered that Ti becomes TiN (titanium nitride) before reacting with the ceramic substrate when nitrogen is present in the atmosphere in the bonding process. When the Ti content inside the brazing material is not less than 6 mass %, the Ti and the ceramic substrate can sufficiently react even in a nitrogen atmosphere.

The bonding process may be performed using either a batch or continuous technique. In a batch technique, the ceramic substrate and the copper plate are placed in a storage container, and heat treatment is performed. In a continuous technique, the ceramic substrate and the copper plate are placed on a belt conveyor, and heat treatment is performed while moving. The batch technique is suited to the bonding process in a vacuum. The continuous technique is suited to the bonding process in a nitrogen atmosphere. When the bonding process is performed using a batch technique, the holding time of the bonding temperature can be reduced. When the bonding process is performed using a continuous technique, the holding time of the bonding temperature is increased, but the suitability for mass production is improved because heat treatment can be continuous.

It is favorable for the cooling rate from the bonding temperature to be not more than 50° C./minute. The Ag diffusion into the copper plate is promoted by the heat in the bonding process. The diffusion rate of Ag can be reduced by holding at the bonding temperature and then cooling at a slow rate of not more than 50° C./minute. Thereby, a region that has a high Ag concentration can be formed inside the copper plate.

As described above, the Ag concentration in the copper plate can be controlled by controlling the grain size of the copper crystal of the copper plate before bonding, the Ag grain size inside the brazing material, the cooling rate after bonding, etc. A bonded body in which the Ag concentration in the copper plate is controlled has excellent TCT characteristics. Also, the warp amount of the bonded body can be not more than 0.1 mm even when the size of the bonded body is large, i.e., not less than 200 mm long or wide.

As necessary, multi-part manufacturing of the bonded body to be manufactured may be performed. Multi-part manufacturing is a method of obtaining small bonded bodies by subdividing a large bonded body. Laser scribing or the like may be performed to make the subdividing easy. According to the embodiment, a bonded body that is suited to multi-part manufacturing can be provided because the bonded body can be enlarged.

The ceramic-copper circuit board 10 can be manufactured by providing the structures of the circuit part 6 and the heat dissipation plate 7 in the copper plate 3 of the obtained bonded body 1. An etching process is effective for providing the circuit part 6 or the heat dissipation plate 7 with a structure. The side surface of the circuit part 6 or the heat dissipation plate 7 may be provided with an inclined shape. The bonding layer 4 may be provided with a jutting portion jutting from the end portion of the circuit part 6 or the heat dissipation plate 7.

EXAMPLES

Examples 1 to 9 and Comparative Examples 1 to 2

The silicon nitride substrates shown in Table 1 were prepared as ceramic substrates.

TABLE 1

| Silicon nitride substrate | Thermal conductivity (W/m · K) | Three-point bending strength (MPa) | Size (Length mm × Width mm × Thickness mm) |
|---|---|---|---|
| SiN1 | 90 | 700 | 240 × 200 × 0.32 |
| SiN2 | 85 | 650 | 200 × 200 × 0.25 |

Then, the copper plates shown in Table 2 were prepared as copper plates. The copper plates each were oxygen-free copper.

TABLE 2

| Copper plate | Plate thickness (mm) | Average crystal grain size (μm) |
|---|---|---|
| Copper plate 1 | 0.8 | 18 |
| Copper plate 2 | 1.0 | 37 |
| Copper plate 3 | 0.8 | 126 |

Then, active metal brazing materials were prepared. The mass % and average particle size $D_{50}$ of the constituent components were as shown in Table 3.

TABLE 3

| | Ag | | Cu | | TiH₂ | | Sn | | C | |
|---|---|---|---|---|---|---|---|---|---|---|
| | Mass % | $D_{50}$ (μm) | Mass % | $D_{50}$ (μm) | Mass % | $D_{50}$ (μm) | Mass % | $D_{50}$ (μm) | Mass % | $D_{50}$ (μm) |
| Brazing material 1 | 47 | 1.5 | 33 | 3.5 | 2 | 2.2 | 18 | 3.0 | 0 | — |
| Brazing material 2 | 43 | 2.0 | 27.7 | 3.4 | 9 | 2.2 | 20 | 2.7 | 0.3 | 1.2 |
| Brazing material 3 | 50 | 2.8 | 27 | 3.2 | 5 | 2.2 | 18 | 3.0 | 0 | — |

Then, the active metal brazing material pastes were prepared, and bonded bodies were made. The silicon nitride substrates, active metal brazing materials, copper plates, and bonding processes were as shown in Table 4. The bonding was performed in a vacuum of not more than 10-3 Pa.

TABLE 4

| | Silicon nitride substrate | Active metal brazing material layer | | Copper plate | | Bonding process | | |
|---|---|---|---|---|---|---|---|---|
| | | Brazing material | Thickness (μm) | Front side | Back side | Holding temperature (° C.) | Holding time (min) | Cooling rate (° C./min) |
| Example 1 | SiN1 | Brazing material 1 | 20 | Copper plate 1 | Copper plate 1 | 830 | 10 | 50 |
| Example 2 | SiN1 | Brazing material 1 | 30 | Copper plate 2 | Copper plate 2 | 810 | 20 | 30 |
| Example 3 | SiN1 | Brazing material 2 | 40 | Copper plate 2 | Copper plate 2 | 780 | 30 | 10 |
| Example 4 | SiN2 | Brazing material 2 | 50 | Copper plate 2 | Copper plate 2 | 750 | 15 | 5 |
| Example 5 | SiN2 | Brazing material 1 | 25 | Copper plate 1 | Copper plate 1 | 770 | 20 | 5 |
| Example 6 | SiN2 | Brazing material 1 | 35 | Copper plate 2 | Copper plate 1 | 750 | 25 | 10 |
| Example 7 | SiN1 | Brazing material 2 | 30 | Copper plate 1 | Copper plate 2 | 820 | 15 | 20 |
| Example 8 | SiN2 | Brazing material 2 | 30 | Copper plate 1 | Copper plate 2 | 830 | 15 | 20 |
| Example 9 | SiN2 | Brazing material 1 | 50 | Copper plate 1 | Copper plate 1 | 880 | 10 | 50 |
| Comparative example 1 | SiN1 | Brazing material 3 | 30 | Copper plate 1 | Copper1 plate 1 | 850 | 20 | 100 |
| Comparative example 2 | SiN2 | Brazing material 3 | 30 | Copper plate 3 | Copper plate 3 | 850 | 20 | 50 |

The Ag concentration in the copper plate was checked for the obtained bonded bodies. The analysis of the Ag concentration was performed by measuring the copper plate in an arbitrary cross section of the bonded body with EDX. For the measurement, JED-2300 made by JEOL Ltd. was used as the SEM-EDX.

The EDX measurement regions were unified to 200 μm in the width direction×50 μm in the thickness direction. The spacing P between the measurement regions was unified to 50 μm. Eight locations of measurement regions were set for bonded bodies having the copper plate thicknesses of 0.8 mm. Ten locations of measurement regions were set for bonded bodies having copper plate thicknesses of 1.0 mm. Based on the EDX measurement results, it was checked whether or not a Ag concentration distribution existed inside the copper plate 3 in which a region having a relatively low Ag concentration, a region having a relatively high Ag concentration, and a region having a relatively low Ag concentration were arranged in this order. It was checked whether or not the high-concentration region existed in the Ag concentration distribution within a range of not less than 0.1 mm and not more than 0.5 mm from the boundary between the bonding layer and the copper plate. Also, the Ag concentration (atomic %) of the high-concentration region was determined.

Furthermore, the warp amounts of the bonded bodies were measured. The warp amount of the long side was measured as the warp amount of the bonded body. Bonded bodies of which the warp amount was not more than 0.2 mm were displayed as good (circle); and bonded bodies of which the warp amount was greater than 0.2 mm were displayed as no-good (cross).

The results are shown in Table 5.

TABLE 5

| | Ag concentration in copper plate | | | |
|---|---|---|---|---|
| | Existence or absence of Ag concentration distribution | Existence of high-concentration region within range of not less than 0.1 mm and not more than 0.5 mm | Ag concentration of high-concentration region | Bonded body warp amount |
| Example 1 | Yes | Yes | 0.10 | ◯ |
| Example 2 | Yes | Yes | 0.16 | ◯ |
| Example 3 | Yes | Yes | 0.18 | ◯ |
| Example 4 | Yes | Yes | 0.32 | ◯ |
| Example 5 | Yes | Yes | 0.33 | ◯ |
| Example 6 | Yes | Yes | 0.22 | ◯ |
| Example 7 | Yes | Yes | 0.26 | ◯ |
| Example 8 | Yes | Yes | 0.27 | ◯ |
| Example 9 | Yes | Yes | 0.39 | ◯ |
| Comparative example 1 | No | No | — | X |
| Comparative example 2 | No | No | — | X |

It can be seen from Table 5 that a Ag concentration distribution exists in a portion of the copper plate for the bonded bodies according to the examples. The high-concentration region inside the Ag concentration distribution was within the range of not less than 0.1 mm and not more than 0.5 mm from the boundary between the bonding layer and the copper plate. The Ag concentration of the high-concentration region was within the range of 0.1 to 0.4 atomic %. Also, inside the Ag concentration distribution, the Ag concentration difference between the high-concentration region and the low-concentration region was not less than 0.05 atomic %. The warp amount of the bonded body was a small value of not more than 0.2 mm.

In contrast, in the bonded bodies according to the comparative examples, a portion does not exist inside the copper plate in which a region having a relatively low Ag concentration, a region having a relatively high Ag concentration, and a region having a relatively low Ag concentration were arranged in this order. In the comparative examples, the Ag concentration gradually decreased from the bonding layer side toward the copper plate front surface. Also, the warp amounts of the bonded bodies were greater than 0.2 mm.

It can be seen that the grain size of the copper crystal of the copper plate, the Ag grain size of the brazing material, the cooling rate of the bonding process, etc., are effective to control the Ag concentration. Also, according to the embodiment, it was found that the warp amount can be reduced even when the long side of the bonded body is enlarged to be not less than 200 mm.

Then, the bonded body was patterned by etching to provide the copper plate of the front side with a circuit part structure, and to provide the copper plate of the backside with a heat dissipation plate structure. Multi-part manufacturing was used to make four ceramic-copper circuit boards by scribing the bonded body.

The TCT characteristics of the ceramic-copper circuit boards were checked.

The TCT test was performed by using −40° C.×30 minutes→room temperature×10 minutes→170° C.×30 minutes→room temperature×10 minutes as 1 cycle, and by performing tests of 1500 cycles and 2500 cycles. The cases where no discrepancies occurred for any of the four were set to best (double circle), the cases where a discrepancy occurred in one were set to good (circle), and the cases where discrepancies occurred in two or more were set to no-good (cross).

The results are shown in Table 6.

TABLE 6

| | TCT test | |
|---|---|---|
| | 1500 cycles | 2500 cycles |
| Example 1 | ◎ | ◎ |
| Example 2 | ◎ | ◎ |
| Example 3 | ◎ | ◎ |
| Example 4 | ◎ | ◎ |
| Example 5 | ◎ | ◎ |
| Example 6 | ◎ | ◎ |
| Example 7 | ◎ | ◎ |
| Example 8 | ◎ | ◎ |
| Example 9 | ◎ | ◯ |
| Comparative example 1 | ◎ | X |
| Comparative example 2 | ◎ | X |

It can be seen from Table 6 that the TCT characteristics were good for the ceramic-copper circuit boards according to the examples. It was found that the TCT characteristics can be improved by controlling the Ag concentration in the copper plate. For the examples 1 to 8, the Ag concentration difference between the high-concentration region and the low-concentration region was within the range of not less than 0.05 atomic % and not more than 0.4 atomic %. For the example 9, the Ag concentration difference between the high-concentration region and the low-concentration region was 0.02 atomic %. It was found that the TCT characteristics slightly degraded when the Ag concentration difference was small.

For the comparative examples, discrepancies did not occur while the number of cycles was low. However, in the comparative examples, the ceramic-copper circuit boards in which discrepancies occurred increased as the number of cycles increased. It is considered that this is affected by the Ag concentration in the copper plate.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments herein may be made without departing from the spirit of the inventions. These embodiments and their modifications are within the scope and spirit of the inventions and are within the scope of the inventions described in the claims and their equivalents. Also, the embodiments described above can be implemented in combination with each other.

What is claimed is:

1. A bonded body, comprising:
a ceramic substrate;
a copper plate; and
a bonding layer located on at least one surface of the ceramic substrate,
the bonding layer bonding the ceramic substrate and the copper plate,
the bonding layer including Ag and Ti, the copper plate including a first region separated from the bonding layer in a thickness direction, a second region located between the bonding layer and the first region, the second region having a higher Ag concentration than the first region, and a third region located between the bonding layer and the second region, the third region having a lower Ag concentration than the second region, wherein a difference between the Ag concentration of the first region and the Ag concentration of the second region is not less than 0.05 atomic %, a difference between the Ag concentration of the second region and the Ag concentration of the third region is not less than 0.05 atomic %, and the Ag concentration of the second region is not less than 0.1 atomic % and not more than 0.4 atomic %.

2. The bonded body according to claim 1, wherein the first region, the second region, and the third region are arranged at a pitch of not less than 30 μm and not more than 100 μm in the thickness direction, the first region, the second region, and the third region each are regions that are not less than 100 μm and not more than 200 μm in a width direction×not less than 10 μm and not more than 100 μm in the thickness direction, and the Ag concentrations of the first, second, and third regions are analyzed by EDX.

3. The bonded body according to either claim 1, wherein the second region is positioned within a range of not less than 0.1 mm and not more than 0.5 mm in the thickness direction from a boundary between the bonding layer and the copper plate.

4. The bonded body according to claim 1, wherein a thickness of the copper plate is not less than 0.8 mm.

5. The bonded body according to claim 1, wherein the ceramic substrate is a silicon nitride substrate.

6. The bonded body according to claim 1, wherein other than Ag and Ti, the bonding layer includes one, two, or more selected from Cu, Sn, In, and C.

7. A ceramic-copper circuit board, comprising: the bonded body according to claim 1.

8. A semiconductor device, comprising: the ceramic-copper circuit board according to claim 7; and a semiconductor element mounted to the ceramic-copper circuit board.

9. The bonded body according to claim 2, wherein the second region is positioned within a range of not less than 0.1 mm and not more than 0.5 mm in the thickness direction from a boundary between the bonding layer and the copper plate.

10. The bonded body according to claim 9, wherein a thickness of the copper plate is not less than 0.8 mm.

11. The bonded body according to claim 10, wherein the ceramic substrate is a silicon nitride substrate.

12. A ceramic-copper circuit board, comprising: the bonded body according to claim 11.

* * * * *